(12) United States Patent
Lin et al.

(10) Patent No.: US 6,614,379 B2
(45) Date of Patent: Sep. 2, 2003

(54) PRECISE DIFFERENTIAL VOLTAGE INTERPOLATION ANALOG-TO-DIGITAL CONVERTER HAVING DOUBLE INTERPOLATION USING NONLINEAR RESISTORS

(75) Inventors: Heng-Chih Lin, Plano, TX (US); Baher S. Haroun, Allen, TX (US)

(73) Assignee: Texas Instruments, Incorporated, Dallas, TX (US)

( * ) Notice: Subject to any disclaimer, the term of this patent is extended or adjusted under 35 U.S.C. 154(b) by 19 days.

(21) Appl. No.: 10/027,710

(22) Filed: Dec. 20, 2001

(65) Prior Publication Data

US 2003/0043065 A1 Mar. 6, 2003

Related U.S. Application Data (60) Provisional application No. 60/315,735, filed on Aug. 29, 2001.

(51) Int. Cl.⁷ .............................................. H03M 1/12
(52) U.S. Cl. ...................................... 341/158; 341/155
(58) Field of Search .............................. 341/155, 159, 341/143, 118, 156

(56) References Cited

U.S. PATENT DOCUMENTS

| | | | |
|---|---|---|---|
| 5,029,305 A | | 7/1991 | Richardson |
| 5,030,954 A | * | 7/1991 | Ribner .................... 341/143 |
| 5,126,742 A | * | 6/1992 | Schmidt et al. ............ 341/156 |
| 5,164,728 A | * | 11/1992 | Matsuzawa et al. ........ 341/159 |
| 5,623,265 A | | 4/1997 | Pawar et al. |
| 6,031,480 A | | 2/2000 | Soenen et al. |
| 6,084,538 A | * | 7/2000 | Kostelnik et al. ........... 341/118 |
| 6,239,733 B1 | | 5/2001 | Lin |

\* cited by examiner

*Primary Examiner*—Jean Bruner Jeanglaude (57) ABSTRACT

A flash analog-to-digital converter having precise differential voltage interpolation without the use of silicide-blocked resistors. A reference conversion voltage output portion converts an analog input voltage on the basis of a plurality of reference voltages into a plurality of reference conversion voltages. An intermediate voltage generating portion includes a predetermined number of non-linear resistance units respectively provided between one voltage and the other voltage in pairs of a predetermined number of the plurality of reference conversion voltages to generate a plurality of intermediate voltages by resistance division using the predetermined number of non-linear resistance units. In addition, the intermediate voltage generating portion generates a plurality of conversion voltages. A digital data output portion outputs the digital output voltage on the basis of the plurality of conversion voltages using double interpolation. Each of the predetermined number of non-linear resistance units includes a first input terminal connected to the one voltage, a second input terminal connected to the other voltage, and a plurality of non-linear resistor elements having the same resistance value connected in series between the first and second input terminals. The plurality of intermediate voltages includes at least part of voltages obtained from one end of each of the plurality of non-linear resistor elements.

5 Claims, 6 Drawing Sheets

PRECISE DIFFERENTIAL VOLTAGE INTERPOLATION ANALOG-TO-DIGITAL CONVERTER HAVING DOUBLE INTERPOLATION USING NONLINEAR RESISTORS

This application claims the benefit of Provisional application No. 60/315,735 filed on Aug. 29, 2001.

FIELD OF THE INVENTION

The present invention relates to analog-to-digital converters, and, more particularly, to an analog-to-digital converter having precise differential voltage double interpolation using non-linear floating semiconductor resistors.

BACKGROUND OF THE INVENTION

Analog-to-digital converters (ADCs) are circuits used to convert signals from the analog domain, where the signals are represented by continuous quantities such as voltage and current, to the digital domain. These circuits can be implemented in a large number of ways. Established A/D conversion techniques include flash, sigma-delta, sub-ranging, successive approximation, and integrating.

A conventional flash type A/D converter is one of the fastest structure which directly utilizes $2^n-1$ comparators to compare the input analog voltage with $2^n-1$ reference voltages and then generate n bits output digital code, where n is the number of bit resolution. The disadvantage of this structure is its large number of comparators needed, thus increasing power consumption and chip area.

An improved flash type A/D converter uses numerous interpolation circuits to reduce the number of comparators. These circuits interpolate the output voltage by means of a number of series-connected impedance elements.

This precise differential voltage interpolation between two known differential voltages has been widely used in mixed signal/analog circuit design, especially in low power circuits where known differential voltages are generated using two amplifiers having high power consumption, and where an intermediate voltage is generated by interpolation to eliminate the power consumption of one amplifier. The demand for low power consumption in portable devices (i.e. cellular phones, PDAs, and digital still cameras) forecasts that precision differential interpolation will be implemented in more designs.

Specifically, the conventional four-input interpolation scheme includes for every pair of amplifiers or buffers, five comparators to set five decision levels. Each amplifier has a differential input and a differential output. Connected to each differential output leg between the two amplifiers is a series of two silicide-blocked resistors. A node between the two resistors defines the intermediate voltage between the voltage level at the first and the second amplifier for each differential output leg. Each of the differential output legs along with the intermediate voltage nodes between each resistor pair define a set of five decision levels. These levels are used to directly translate the analog input voltage level into a digital one.

In an effort to achieve good linearity, interpolation resistors need to be precise and cannot have terminal voltage dependency beyond a certain level. Silicide-blocked resistors meet these requirements, however, they require large area and extra processing steps; thereby increasing the cost of the ADC.

Thus, there exists a need for an inexpensive analog-to-digital converter having a precise differential voltage interpolation that does not implement the use of silicide blocked resistors.

SUMMARY OF THE INVENTION

To address the above-discussed deficiencies of flash analog-to-digital converters (ADC), the present invention teaches an inexpensive ADC having precise differential voltage interpolation without the use of silicide-blocked resistors. The ADC in accordance with the present invention includes a reference conversion voltage output portion for converting an analog input voltage on the basis of a plurality of reference voltages into a plurality of reference conversion voltages. An intermediate voltage generating portion includes a predetermined number of non-linear resistance units respectively provided between one voltage and the other voltage in pairs of a predetermined number of the plurality of reference conversion voltages to generate a plurality of intermediate voltages by resistance division using the predetermined number of non-linear resistance units. A voltage interpolator connects to the intermediate voltage generating portion to generate a plurality of conversion voltages. A digital data output portion couples to receive the plurality of conversion voltages to provide the digital output voltage using double interpolation. Each of the predetermined number of non-linear resistance units includes a first input terminal connected to the one voltage, a second input terminal connected to the other voltage, and a plurality of non-linear resistor elements having the same resistance value connected in series between the first and second input terminals. The plurality of intermediate voltages includes at least part of voltages obtained from one end of each of the plurality of non-linear resistor elements.

The invention solves the insufficiencies of the prior art by using a double interpolation scheme and input common mode voltage adjustment technique, where precise differential voltage interpolation is achieved by using inexpensive, small semiconductor resistor either n-well or MOS resistors.

Advantages of this design include but are not limited to a inexpensive ADC having precise differential voltage interpolation such that silicon area and cost are reduced a 5% cost reduction in current standard CMOS technology which translates to a greater than 5% profit margin.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 2b displays a diagram demonstrating the crossing points detected by the current comparators of FIG. 2a;

FIG. 3b shows a diagram demonstrating the crossing points detected by the current comparators of FIG. 3a;

DETAILED DESCRIPTION OF PREFERRED EMBODIMENTS

Figure 1:
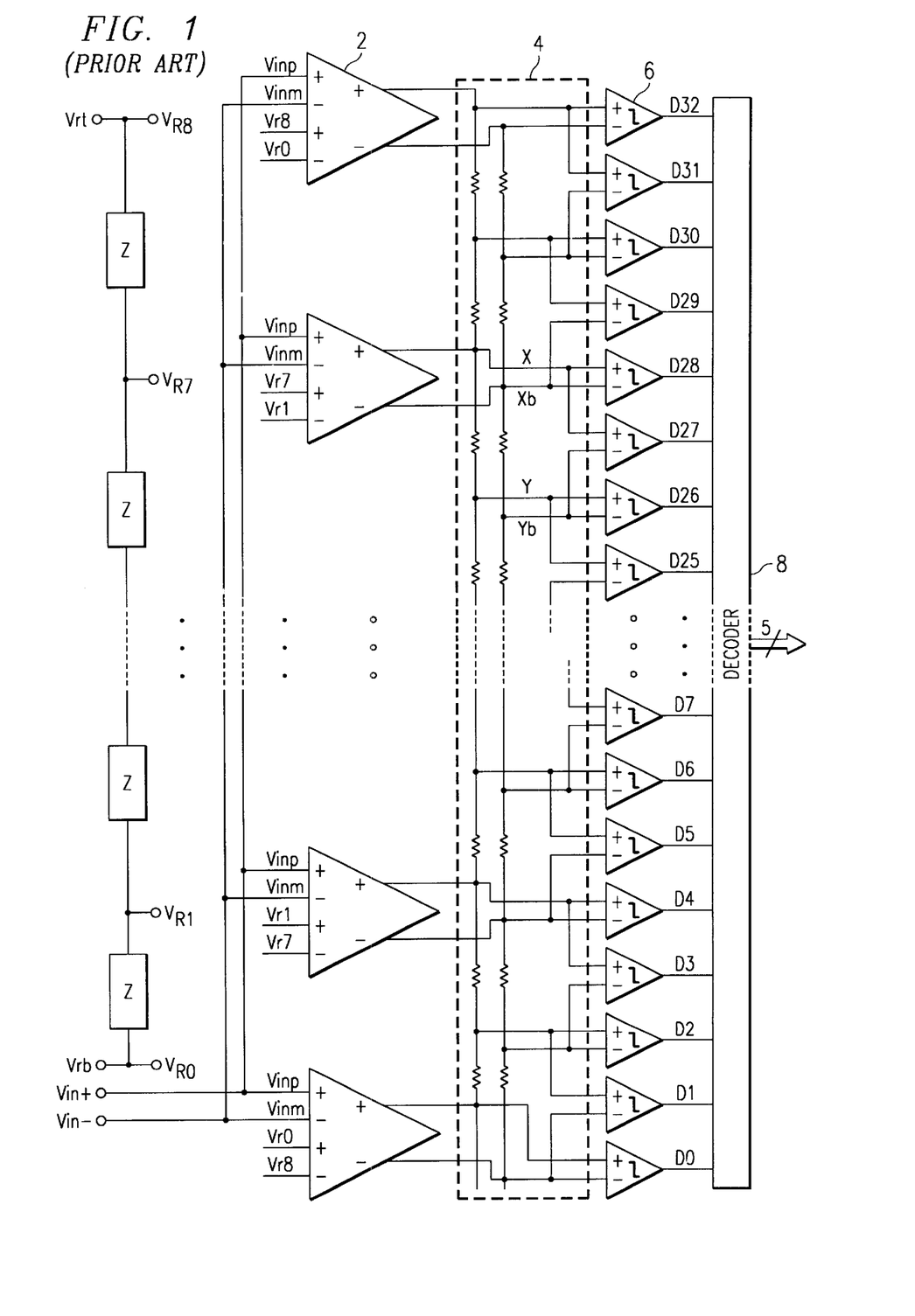
FIG. 1 illustrates a known flash interpolation ADC.
Figure 2A:
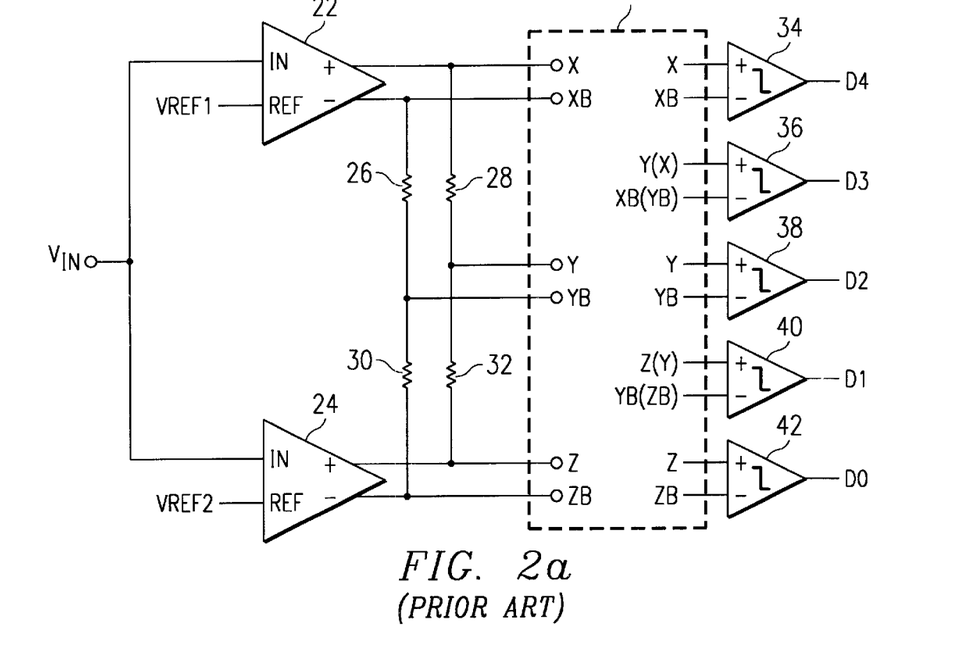
FIG. 2a shows the known flash ADC having a conventional four-way interpolation scheme.

The present invention is best understood by comparison with the prior art. Hence, this detailed description begins with a discussion of the known flash ADC as shown in FIG. 1. As described flash ADC shown in FIG. 1 includes several amplifiers 2, a voltage interpolator 4, several voltage comparators 6, and a decoder 8. In an effort to describe the operation of FIG. 1, FIG. 2a shows an abridged version of the conventional four way interpolation circuit in the known flash ADC of FIG. 1. It requires two amplifiers, 22 and 24, as well as five voltage comparators, 34–42, to set five decision levels, D0–D4. In the alternative, the amplifier 22 and 24 may be substituted with buffers and the voltage comparators 34–42 may be substituted with amplifiers.

The reference conversion voltage output portion includes amplifiers 22 and 24 to convert an analog input voltage $V_{in}$ or analog differential input voltage $V_{in}^+$ and $V_{in}^-$ (as shown in FIG. 1) on the basis of a plurality of reference voltages, $V_{ref1}-V_{ref2}$, into a plurality of reference conversion voltages at nodes x, xb, z and zb. An intermediate voltage generating portion includes a predetermined number of linear resistance units, 26–32, respectively provided between one reference conversion voltage at nodes x and z and the other voltage at nodes xb and zb in pairs to generate a plurality of intermediate voltages by resistance division using the predetermined number of linear resistance units at nodes y and yb. A voltage interpolator 43 connects to the intermediate voltage generating portion to generate a plurality of conversion voltages. A digital data output portion, which includes voltage comparators 34–42, couples to receive the plurality of conversion voltages to generate the digital output voltage at nodes D0–D4 using single interpolation. Each of the predetermined number of linear resistance units 26–32 includes a first input terminal connected to the one voltage, a second input terminal connected to the other voltage. Each linear resistance unit includes a linear resistor element having the same resistance value connected in series between the first and second input terminals. The plurality of intermediate voltages at nodes y and yb includes at least part of voltages obtained from one end of each of the plurality of linear resistor elements 26–32.

Figure 2B:
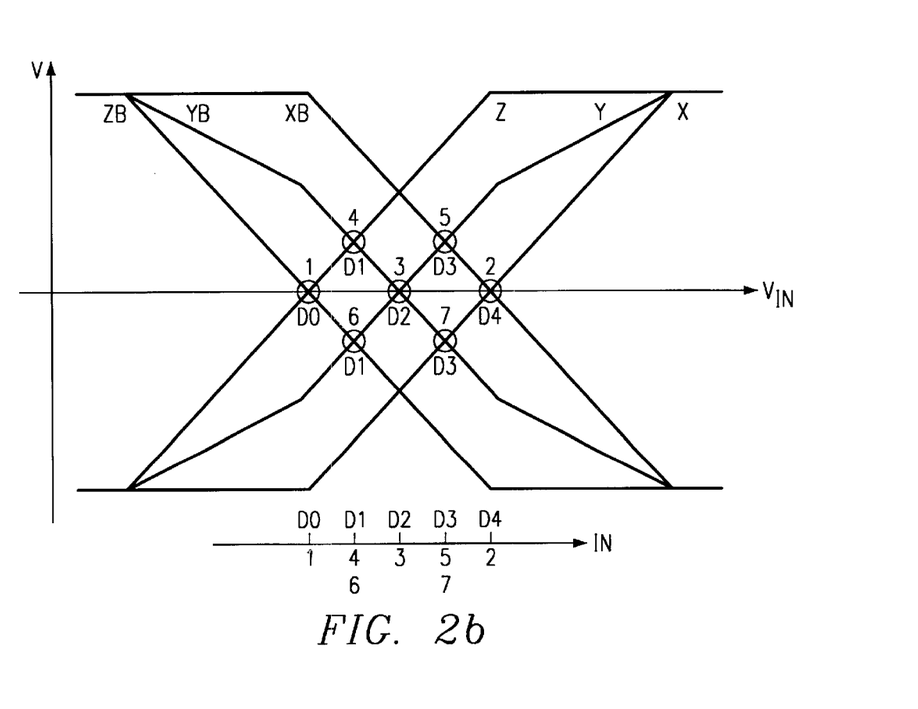

FIG. 2b illustrates a diagram demonstrating the crossing points detected by voltage comparators, 34–42, in FIG. 2a, wherein the X-axis represents the input voltage $V_{in}$ and the Y-axis represents the voltage at nodes x, y, z, xb, yb, and zb. Specifically, the solid dots represent the crossing points or the decision levels, D0–D4, detected by the voltage comparators, 34–42. The accuracy of the interpolation points 4 and 5 or 6 and 7 highly depends on the accuracy of the interpolation resistors, 26–32. In order to achieve high precision interpolations, designers usually use precise matched resistors, such as silicide blocked resistors. These resistors, 26–32, however, occupy large area and add extra cost due to extra process steps.

Specifically, nodes z and zb determine input crossing point 1, x and xb determine input crossing point 2, nodes y and yb determine input crossing point 3. The other two crossing points can be determined by comparing nodes z and yb for crossing point 4 and comparing nodes y and xb for crossing point 5. In the alternative, comparing nodes y and zb determine input crossing point 6 and comparing nodes x and yb determine input crossing point 7. Resistance values of resistors 26–32 need to be precise in order not to have a biased interpolation for crossing points 4 through 7.

Figure 3A:
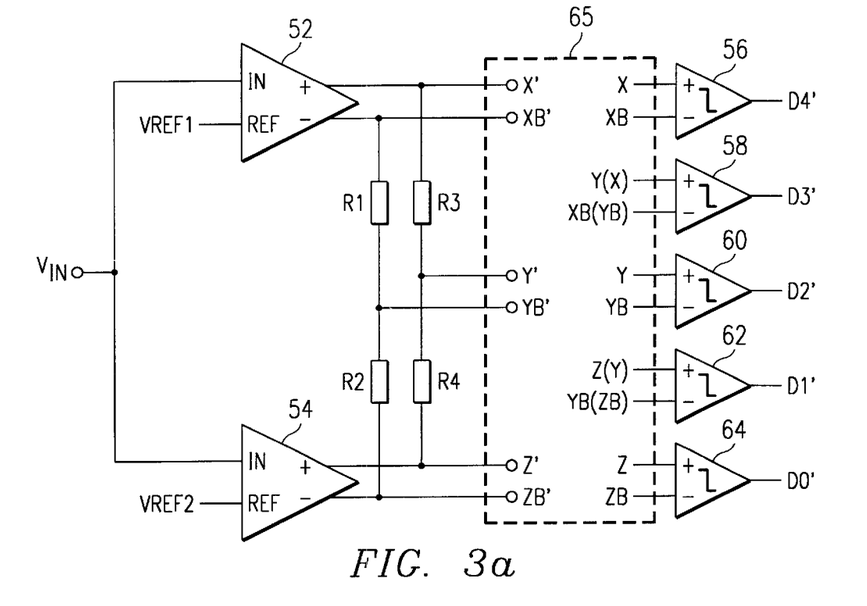
FIG. 3a illustrates a four-way interpolation scheme in a flash ADC in accordance with the present invention.

An alternative embodiment, illustrated in FIG. 3a, to achieve interpolations is to use non-linear semiconductor resistors, R1–R4, such as n-well resistors or MOS/CMOS transmission gate. The reference conversion voltage output portion includes amplifiers 52 and 54 to convert an analog input voltage $V_{in}$ on the basis of a plurality of reference voltages, $V_{ref1}-V_{ref2}$, into a plurality of reference conversion voltages at nodes x', xb', z' and zb'. An intermediate voltage generating portion includes a predetermined number of non-linear resistance units, R1–R4, respectively provided between one reference conversion voltage at nodes x' and z' and the other voltage at nodes xb' and zb' in pairs to generate a plurality of intermediate voltages by resistance division using the predetermined number of non-linear resistance units at nodes y' and yb'. A voltage interpolator 65 connects to the intermediate voltage generating portion to generate a plurality of conversion voltages. A digital data output portion, which includes voltage comparators 56–64, couples to receive the plurality of conversion voltages to generate the digital output voltage at nodes D0'–D4' using single interpolation. Each of the predetermined number of non-linear resistance units R1–R4 includes a resistive element connected in series between a first and second input terminal. Each linear resistance unit R1–R4 includes a linear resistor element having the same resistance value connected in series between the first and second input terminals. The plurality of intermediate voltages at nodes y' and yb' includes at least part of voltages obtained from one end of each of the plurality of linear resistor elements R1–R4.

Figure 3B:
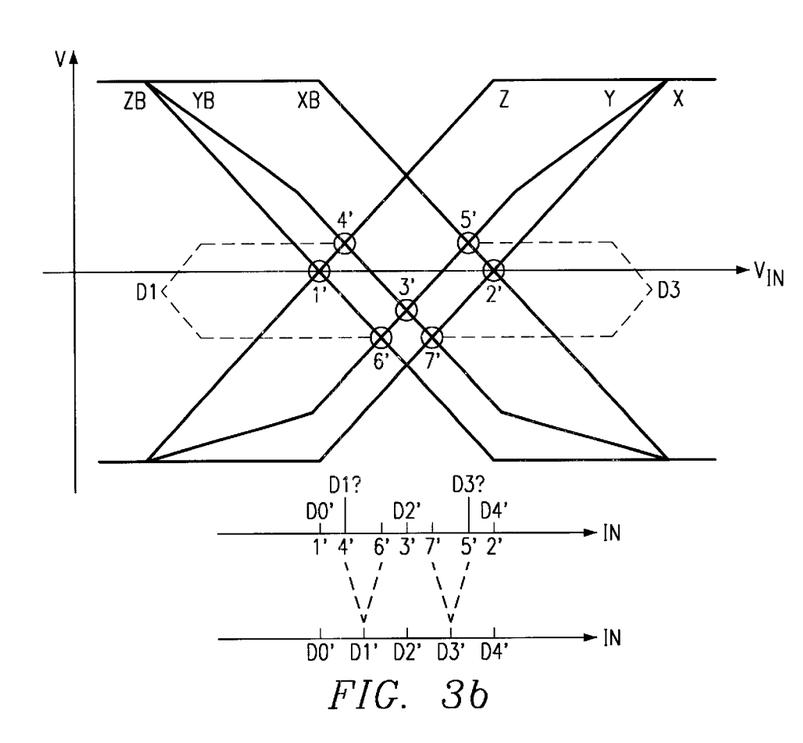

This approach, however, results in inaccurate interpolations as shown in FIG. 3b. In particular, FIG. 3b illustrates a diagram demonstrating the crossing points detected by voltage comparators, 56–64, of FIG. 3a, wherein the X-axis represents the corresponding input voltage $V_{in}$ and the Y-axis represents the voltage at nodes x, y, z, xb, yb, and zb. Specifically, the solid dots represent the crossing points or the decision levels, D0'–D4', detected by the voltage comparators, 56–64.

Specifically, nodes z' and zb' determine input crossing point 1', nodes x' and xb' determine input crossing point 2', nodes y' and yb' determine input crossing point 3'. The other two crossing points can be determined by comparing nodes z' and yb' for crossing point 4' and comparing nodes y' and xb' for crossing point 5'. In the alternative, comparing nodes y' and zb' determine input crossing point 6' and comparing nodes x' and yb' determine input crossing point 7'.

Since resistors, R1–R4, are non-linear voltage dependent resistors, the intermediate voltages at y' and yb' are not accurately midway between x,z and xb, zb as would be the case when R1–R4 are linear and equal. In the case of FIG. 3b, crossing points, 1'–7', are biased towards the lower voltage side as shown. In this case, y' is biased closer to x' and yb' is biased closer to zb'. The result is crossing point 4' (or 7') is biased to the left the crossing point 6' (or 5') is biased to the right of the ideal corresponding crossing points in FIG. 2b. Therefore, the incorporation of double interpolation for crossing points 1'–7' can be used to correct the bias to reconfigure the crossing points 1'–7' to be the same as crossing points 1–7 of the conventional four input interpolation scheme shown in FIG. 2b.

Figure 4:
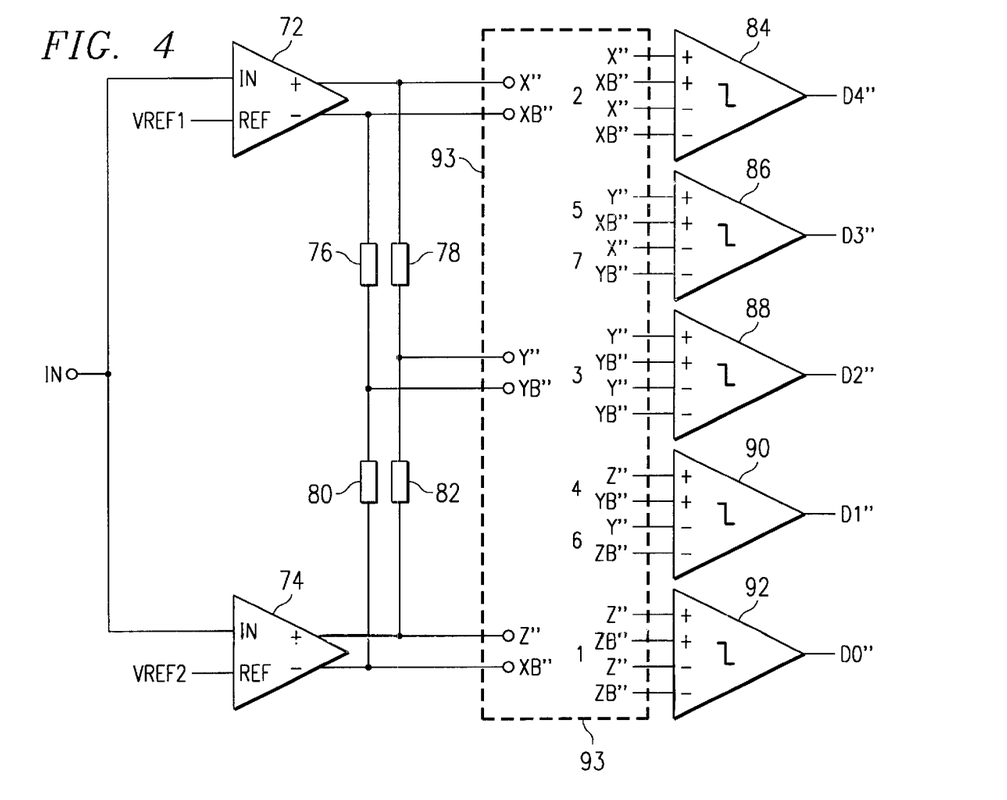
FIG. 4 displays a four-way double interpolation scheme in a flash ADC in accordance with the present invention.

Thereby, the use of in-precise, low cost semiconductor resistors achieve high precision interpolation through the use of double interpolation of crossing points 4" and 6" (5" and 7"), as long as the bias of y' and yb' are symmetrical and use of an input common mode voltage adjustment technique is implemented as illustrated in FIG. 4. Specifically, FIG. 4 shows the flash ADC having double interpolation in accordance with the present invention using non-linear semiconductor resistors, 76–82, such as n-well resistors or MOS/CMOS transmission gate. The reference conversion voltage output portion includes amplifiers 72 and 74 to convert an analog input voltage $V_{in}$ on the basis of a plurality of reference voltages, $V_{ref1}$–$V_{ref2}$, into a plurality of reference conversion voltages at nodes x", xb", z" and zb". An intermediate voltage generating portion includes a predetermined number of non-linear resistance units, 76–82, respectively provided between one reference conversion voltage at nodes x" and z" and the other voltage at nodes xb" and zb" in pairs to generate a plurality of intermediate voltages by resistance division using the predetermined number of non-linear resistance units at nodes y" and yb". A voltage interpolator 93 connects to the intermediate voltage generating portion to generate a plurality of conversion voltages. A digital data output portion, which includes voltage comparators 84–92, couples to receive the plurality of conversion voltages to generate the digital output voltage at nodes D0"–D4" using single interpolation. These four-input comparators, 84–92, are used to achieve double interpolation where crossing points 4"–7" are further interpolated from that shown in FIG. 3b in the internal currents of comparators, 84–92, to achieve the correct decision level. Each of the predetermined number of non-linear resistance units 76–82 includes a non-linear resistor element, such as n-well resistors or MOS/CMOS transmission gates, connected in series between the first and second input terminals. The plurality of intermediate voltages at nodes y" and yb" includes at least part of voltages obtained from one end of each of the plurality of linear resistor elements 76–82.

Figure 5A:
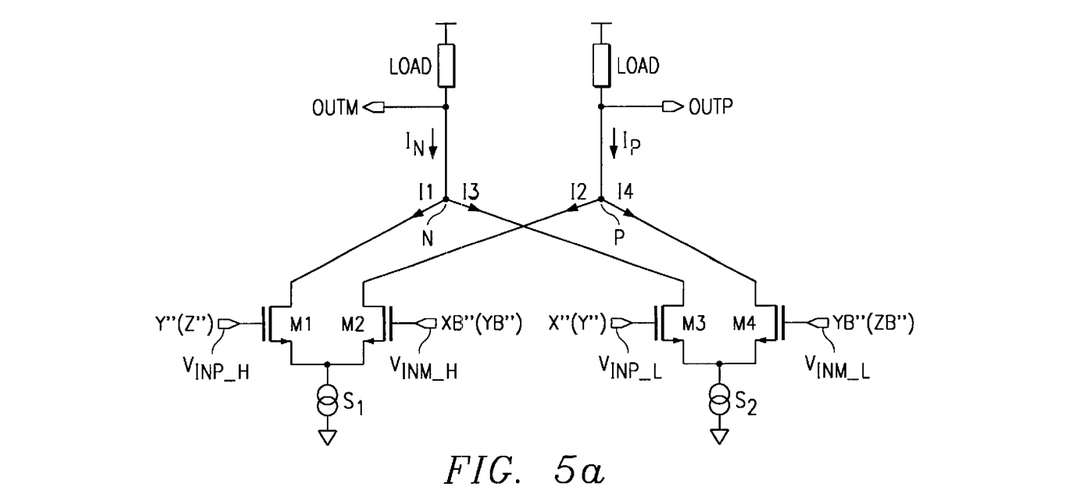
FIG. 5a shows an analog output version of the four-input comparator of FIG. 4.
Figure 5B:
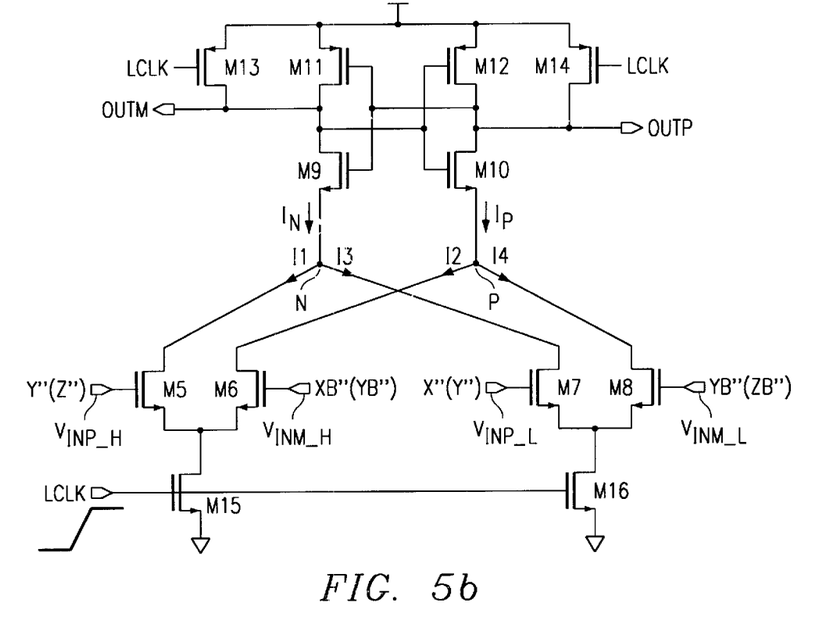
FIG. 5b illustrates a digital output version of the four-input comparator of FIG. 4.

An analog and digital version of the 4-input comparators 84–92, are shown in FIGS. 5a and 5b, respectively. Common mode voltage difference between two input transistor pairs, such as transistor pair $M_1$ and $M_2$ or transistor pair $M_3$ and $M_4$, must be compensated for by adjusting the input transistor ratio, M1 (M2) vs. M3 (M4). The transistor, $M_1$–$M_4$, having higher common mode must have a smaller W/L ratio between the two transistors within the input transistor pair $M_1$ and $M_2$ or $M_3$ and $M_4$. At summing nodes, N and P, the contribution of current pair, $I_N=I_1+I_3$ and $I_P=I_2+I_4$ are balanced for each crossing point if $V_{INP\_H}-V_{INM\_H}=V_{INM\_L}-V_{INP\_L}$.

The small signal current $I_N=I_1+I_3$ is proportional to $(V_{INP\_H}-V_{INM\_H})+(V_{INP\_L}-V_{INM\_L})$; while small signal current $I_P=I_2+I_4$ is proportional to $(V_{INM\_H}-V_{INP\_H})+(V_{INM\_L}-V_{INP\_L})$. The decision level is achieved when $I_N=I_P=0$. In the case of comparator 86, for example, $I_N$ is proportional to $(V_{y'}-V_{xb'})+(V_{x'}-V_{yb'})$ and $I_P=-I_N$ where $V_{y'}=V_{xb'}$ defines the crossing point 5" and $V_{x'}-V_{yb}$ defines the crossing point 7". The net result of decision level for comparator 86 is therefore in the middle of crossing point 5" and 7", or the desired decision level D1". Similar conclusion can be achieved for comparator 90 where the correct decision level is achieved by double interpolate crossing points 4" and 6".

Specifically, FIG. 5a shows the analog output version of the four input comparators 84–92 of FIG. 4. As shown, a differential pair of transistors, $M_1$ and $M_2$, and another differential pair, $M_3$ and $M_4$, couple to two respective current sources, $S_1$ and $S_2$, that provide tail currents to be applied to the differential transistor pairs. Both current sources, $S_1$ and $S_2$, have the same current level. In operation, when the voltage at node yb" is higher than the voltage at node x", then the tail current of current source $S_2$ will flow fully across transistor $M_4$. In the alternative, when the voltage at node yb" is lower than the voltage at node x", then the tail current of current source $S_2$ will flow fully across transistor $M_3$. If the voltage at node yb" is equal than the voltage at node x", then the tail current of current source $S_2$ will flow equally across both transistors, $M_3$ and $M_4$. Currents $I_1$ and $I_3$ combine at node N and currents $I_2$ and $I_4$ combine at node P. At output nodes $Out_M$ and $Out_P$, the voltage is the combined currents difference $(I_P-I_N)$ times the resistance loads shown.

FIG. 5b displays the digital version of the 4-input comparator in accordance with the present invention as shown in FIG. 4. Similar to FIG. 5a, the input pair of transistors, $M_5$ and $M_6$ or $M_7$ and $M_8$, with higher common mode voltage needs to have smaller W/L ratio to achieve better interpolation. Transistors $M_{15}$ and $M_{16}$ provide tail current for the differential transistor pairs of transistors, $M_5$–$M_8$. Transistors $M_9$, $M_{10}$, $M_{11}$, $M_{12}$, $M_{13}$, and $M_{14}$ form a latch and perform the same function as the load shown in FIG. 5a with exception that the output nodes $Out_M$ and $Out_P$ of FIG. 5b transmit digital outputs as opposed to the analog outputs of FIG. 5a. Transistors, $M_{13}$ and $M_{14}$, reset outputs, $OUT_M$ and $OUT_P$, when clock input LCLK is low. At the rising edge of clock input LCLK, comparison of currents $I_N (=I_1+I_3)$ and $I_P (=I_2+I_4)$ is performed and the decision is latched.

Figure 6A:
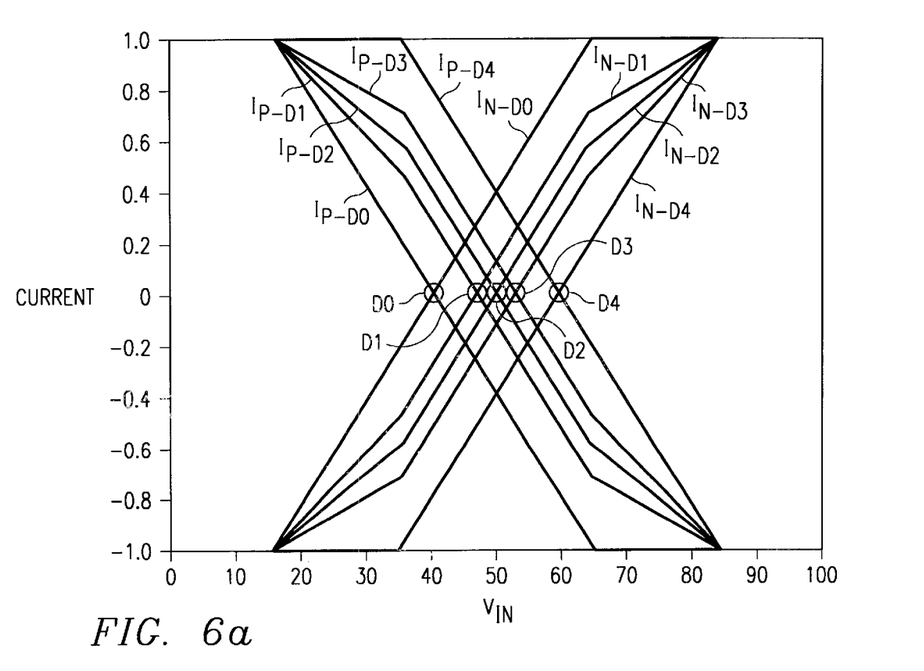
FIG. 6a shows a diagram demonstrating the crossing points for the first branch detected by the current comparators of FIG. 4.
Figure 6B:
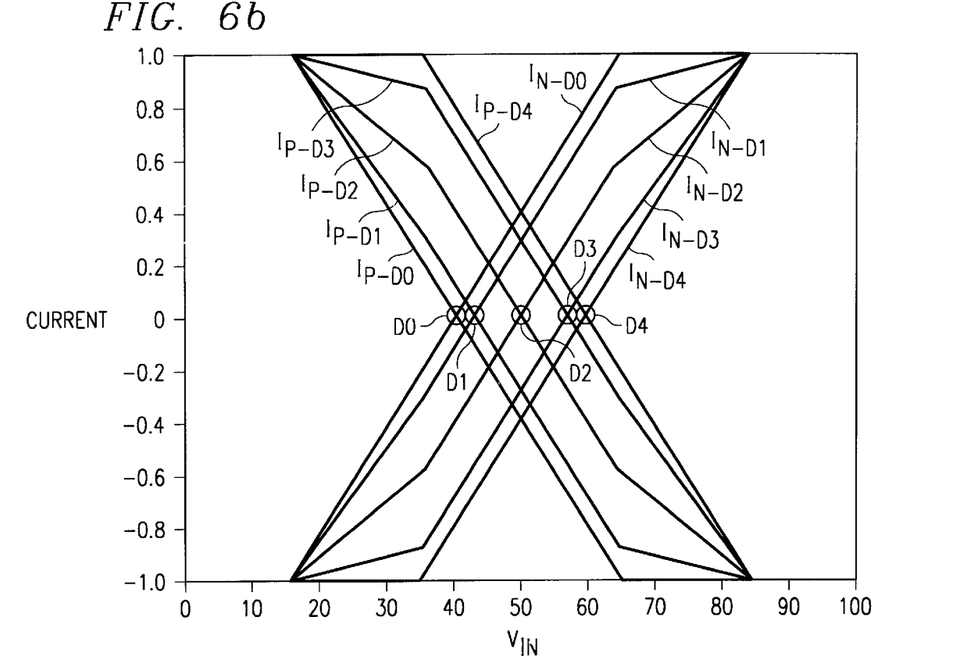
FIG. 6b illustrates a diagram demonstrating the crossing points for the second branch detected by the current comparators of FIG. 4.
Figure 6C:
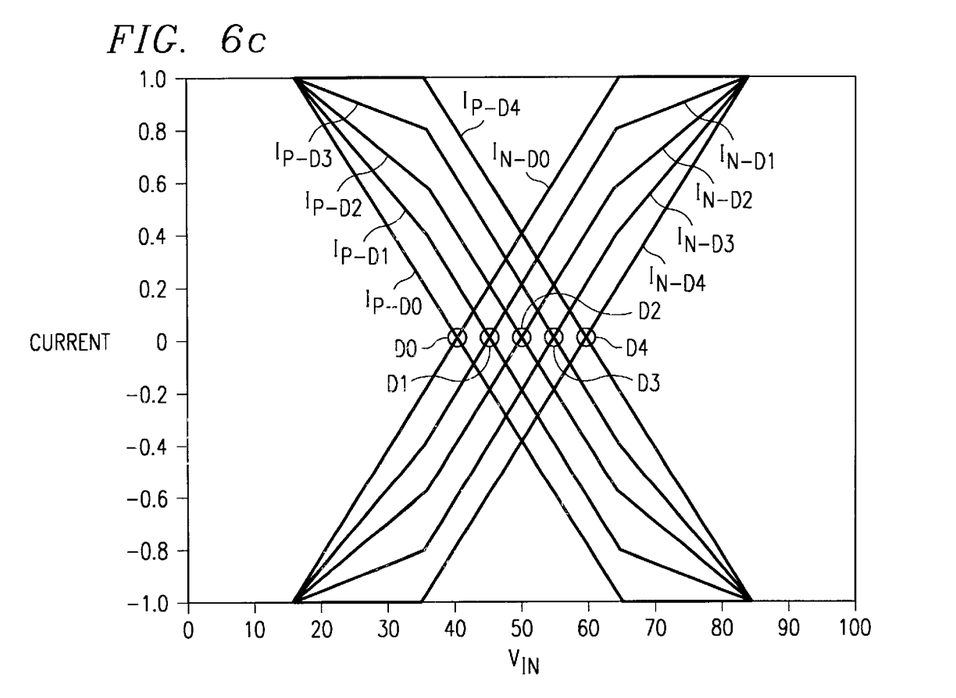
FIG. 6c shows a diagram demonstrating the crossing points detected by the current comparators as a summation of FIGS. 6a and 6b.

FIGS. 6a, b, and c illustrate the result of double interpolation by detailing the internal currents in the comparators of FIG. 5. Each curve corresponds the current $I_P$ and $I_N$ in each four-input comparator. The components of the currents in each branch are shown in FIGS. 6a and 6b. The sums of the components are shown in FIG. 6c. For example, for comparator 86, the two components of current $I_1$ are shown as the curves Vx–Vyb in FIG. 6a and Vy–Vxb in FIG. 6b. The total current $I_1$ is representing the sum of the curves (Vx–Vyb)+(Vy–Vxb) is shown in FIG. 6c. The crossing points represent the decision levels, D0–D4. As can be seen from the equal spacing of the decision levels, D0–D4, double interpolation according to the present invention achieves an accurate interpolation using non-linear, non-expensive semiconductor resistors.

Advantages of this design include but are not limited to a flash ADC having a high performance, simple, and cost effective design. Specifically, the present invention reduces silicon area and cost by 5% in current standard CMOS technology which translates to a greater than 5% profit margin.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

We claim:

1. An analog-to-digital converter having an analog input voltage and a digital output, comprising:
    a reference conversion voltage output portion for converting the analog input voltage on the basis of a plurality of reference voltages to output a plurality of reference conversion voltages;
    an intermediate voltage generating portion coupled to receive the plurality of reference conversion voltages, the intermediate voltage generating portion having a predetermined number of non-linear resistance units respectively provided between a first reference conversion voltage and a second reference conversion voltage in pairs of a predetermined number of the plurality of reference conversion voltages to generate a plurality of intermediate voltages by resistance division using the predetermined number of non-linear resistance units;
    a voltage interpolator coupled to the intermediate voltage generating portion to generate a plurality of conversion voltages; and
    a digital data output portion coupled to the intermediate voltage portion to generate the digital output applying double interpolation to the plurality of conversion voltages, wherein the digital data output portion includes a plurality of comparators coupled to receive the plurality of conversion voltages to provide the digital output,
    wherein each of the predetermined number of non-linear resistance units comprises, a first input terminal connected to the first reference conversion voltage, a second input terminal connected to the second reference conversion voltage, a plurality of non-linear resistor elements having the same resistance value connected in series between the first and second input terminals.

2. The analog-to-digital converter according to claim 1, wherein the plurality of reference conversion voltages include a first number of first reference conversion voltages and a second number of second reference conversion voltages,
    the reference conversion voltage output portion including a first partial reference conversion voltage output portion for outputting the first number of first reference conversion voltages and a second partial reference conversion voltage output portion for outputting the second number of second reference conversion voltages, the first and second partial reference conversion voltage output portions being formed separately from each other,
    wherein the intermediate voltage generating portion is provided between the first partial reference conversion voltage output portion and the second partial reference conversion voltage output portion.

3. The analog-to-digital converter according to claim 2, wherein the first partial reference conversion voltage output portion includes a differential amplifier, having a first and second input and an output, the first input coupled to the input analog voltage and the second input coupled to one of the plurality of reference voltages, the output to yield one of the plurality of reference conversion voltages.

4. The analog-to-digital converter according to claim 2, wherein the second partial reference conversion voltage output portion is a differential amplifier, having a first and second input and an output, the first input coupled to the input analog voltage and the second input coupled to one of the plurality of reference voltages, the output to yield one of the plurality of reference conversion voltages.

5. The analog-to-digital converter according to claim 1, wherein each of the plurality of comparators is a four-input comparator coupled to receive the plurality of intermediate voltages and the plurality of conversion voltages to perform double interpolation.

* * * * *